US005252360A

United States Patent [19]

Hüttl et al.

[11] Patent Number: 5,252,360

[45] Date of Patent: Oct. 12, 1993

[54] PROCESS FOR THE PROTECTION OF AN ENGRAVED ROLL OR PLATE BY COATING AN ENGRAVED SURFACE WITH AN INTERLAYER AND THEREAFTER APPLYING A WEAR-RESISTANT LAYER TO THE INTERLAYER BY PVD

[76] Inventors: Wolfgang Hüttl, Am Brunnenberg 6, 5253 Lindlar; Alois Vester, Niederkasseler Str. 11c, 5210 Troisdorf-Spich, both of Fed. Rep. of Germany

[21] Appl. No.: 911,694

[22] Filed: Jul. 10, 1992

Related U.S. Application Data

[63] Continuation-in-part of Ser. No. 670,002, Mar. 15, 1991, abandoned.

[30] Foreign Application Priority Data

Mar. 15, 1990 [DE] Fed. Rep. of Germany ....... 4008254

[51] Int. Cl.[5] .............................................. C23C 16/00

[52] U.S. Cl. ................................ 427/255.2; 427/295; 427/319; 427/350; 427/367; 427/368; 427/419.7; 427/427; 427/437; 427/438; 427/443.1; 204/192.16; 205/184

[58] Field of Search ..................... 427/255.2, 295, 319, 427/350, 374.1, 419.7, 427, 438, 443.1; 204/192.16; 205/184

[56] References Cited

U.S. PATENT DOCUMENTS

Re. 32,244 9/1986 Anderson ........................ 427/419.2

FOREIGN PATENT DOCUMENTS 311847 9/1988 European Pat. Off. .

3809139 9/1989 Fed. Rep. of Germany .

*Primary Examiner*—Shrive Beck

*Assistant Examiner*—Benjamin L. Utech

*Attorney, Agent, or Firm*—Antonelli, Terry, Stout & Kraus

[57] ABSTRACT

A process for the production of engraved rolls and plates for printing operations wherein there are applied to a base member of metal, after it has been engraved, at least two layers of a metal and, respectively, a metal compound for increasing the hardness and the corrosion protection in order to achieve surface hardness values of at least 2000 HV.

13 Claims, 1 Drawing Sheet

PROCESS FOR THE PROTECTION OF AN ENGRAVED ROLL OR PLATE BY COATING AN ENGRAVED SURFACE WITH AN INTERLAYER AND THEREAFTER APPLYING A WEAR-RESISTANT LAYER TO THE INTERLAYER BY PVD

CROSS REFERENCE TO RELATED APPLICATION

This application is a continuation-in-part of application Ser. No. 670,002, filed Mar. 15, 1991, now abandoned.

BACKGROUND OF THE INVENTION

This invention relates to a process for the protection of engraved rolls and plates for flexographic printing, intaglio or printing, or coating, wherein a base member of metal, on the surface of which a gravure is produced mechanically, electromechanically, or by means of etching, in correspondence with a desired embossed pattern, is provided and wherein protective layers for increasing corrosion resistance of a metal or of a metal compound or a ceramic component are applied on the engraved surface of the base member in order to increase the wear resistance and corrosion resistance.

It has been known for a long time to coat articles of metal with a protective layer for increasing corrosion resistance, hardness, and wear resistance. In particular, metallic articles are provided with a metallic coating of, for example, nickel or chromium in most cases by electrodeposition or by chemical reduction. In accordance with this electroplating method, it is possible to obtain, with nickel and, respectively, chromium, wearproof surfaces on metallic substrates with Vickers hardnesses of up to about 950 HV for nickel and 1200 HV for chromium, respectively. Vickers hardness HV is measured by using a foursided diamond pyramide with tip angle 136°.

It is furthermore known to vapor-deposit layer of hard material in a vacuum process onto metallic or nonmetallic surfaces of components in order to render the components wearproof. In the CVD process—chemical vapor deposition—the metallic proportion must first be released by cracking from a gaseous starting material before the metal reacts with the gas. The CVD process requires high reaction temperatures of about 800° to 1100° C. In the PVD process—physical vapor deposition—the metallic vapor is produced directly and reacts on the surface of the article to be coated with the gas to form the desired wear-resistant layer. The PVD method makes it possible to deposit the hard materials for the wearproof layer at temperatures of between 200° and 650° C.

For example German DE 38 09 139 describes depositing a special interlayer with a maximum thickness up to 5 μm consisting of palladium-nickel-alloy electrolytically on a metal base or a synthetic resin base with the aim of improving the adhesion of an outer surface layer and applying an outer surface layer onto this interlayer by PVD using-metallic borides, carbides, nitrides or the like.

A special area for manufacturing products with wearproof surfaces is represented by rolls, or plates equipped with gravures which are also utilized as embossing tools. Such engraved rolls and plates have been realized heretofore with wearproof surfaces of high hardness of above 1700 HV merely on the basis of ceramic base members wherein the gravure is worked into the surfaces of the ceramic base member with the aid of laser beams in correspondence with the desired embossing patter. However, the gravures on the ceramic base members are not 100% reproducible on account of the numerous parameters that must be considered when machining ceramic components, so that each engraved roll or plate, with an identical gravure master, will turn out slightly different.

SUMMARY OF THE INVENTION

The invention is based on the object of providing gravures on metallic base members, such as rolls and plates, with wear-resistant layers of high hardness of at least 2000 HV according to Vickers hardness, which gravures can be reproduced with high precision.

According to this invention, in order to attain the above-posed object, a process is proposed for the production of engraved rolls or plates of high wear resistance of the type heretofore described wherein (a) a dense interlayer of a metal-containing or ceramic-containing component having a thickness of about 10–15 μm and a hardness of at least 850 HV according to Vickers hardness is applied to the surface of the metal base member provided with the gravure;

thereby reproducing the engraved gravure of the surface of the base member to a surface of the interlayer b) thereafter the surface of the interlayer applied on the engraved surface of the base member is polished and cleaned, c) thereafter the engraved based member equipped with the interlayer in subjected to vacuum and being kept under vacuum and thereby continuously heated up for tempering purposes to a temperature of at least 240° C to about 480° C. and being subjected to this temperature for a time period of at least 1 hour up to about 4 hours, d) then at the end of the tempering period whilst the tempered engraved base member equipped with the interlayer being continuously subjected to vacuum and being kept in a heated up condition of a temperature between 200 and 480° C. there is applied to the surface of the interlayer applied on the surface of the base member provided with the gravure, a wear-resistant layer of a metal compound having a hardness according to Vickers hardness of at least 2000 HV by vapor deposition in accordance with the PVD process in a thickness of about 4–8μm, thereby reproducing the engraved gravure of the surface of the base member with applied interlayer to the surface of the vapor-deposited wear-resistant layer e) after cooling and suspension of vacuum the surface of the vapor-deposited wear-resistant layer, is polished.

It is possible by means of the process according to this invention to equip engraved rolls and engraved plates, for example for the performance of printing operations or coating processes or for embossing tools, with a wearproof surface having a hardness of at least 2000 HV. The process is reproducible, i.e. base members with an identical engraving can be equipped according to the process of this invention with a wear-resistant layer wherein the embossed patterns of the thus-equipped engraved rolls or plates are manufactured without deviations from one another, i.e. in a reproducible fashion. The process of this invention makes it possible to produce the gravures on rolls and plates in a reproducible way so that identically engraved rolls and, respectively, plates can be produced which are equipped with a wear-resistant layer for long service lives and with a high hardness according to Vickers of above 2000, preferably above 2500 HV.

The interlayer herein takes over the function of corrosion protection for the metallic base member; in this connection, the interlayer should be non-porous, maximally dense and homogeneous and should already exhibit a relatively high hardness. The interlayer is preferably an autocatalytically deposited nickel-phosphorus alloy with a phosphorus content of 5–13% by weight, preferably 8–13% by weight, the remainder consists essentially of nickel. The subsequent heat treatment under vacuum for the purpose of tempering is combined with the appliance of the wear-resistant layer, i.e. with the PVD process. The tempering promotes the hardening of the nickel-phosphorus alloy, so that hardnesses are attained for this layer of approximately at least 900 HV. An interlayer of a nickel-phosphorus alloy is preferably tempered at temperatures of above 240° C. up to about 420° C. under vacuum for a time period of one to three or four hours, depending upon the largeness and thickness of the base member. The process of production of engraved rolls or plates with high wear resistance and corrosion resistance according to the invention is very economically. The invention uses an interlayer based upon nickel, which is additionally hardened by a tempering process.

Advantageously, it is also possible that an interlayer showing initially a high surface hardness is built up of a ceramic based on silicon carbides and is sprayed as a thin layer onto the engraved surface of the base member. This interlayer based on ceramic exhibits a hardness of 1500 to 2000 HV.

By means of the process according to this invention, it is possible to attain, in particular, high hardnesses of the subsequently to be applied wear-resistant layers also by the feature that already the interlayer exhibits a high hardness after tempering. In order to preserve the precision of the embossed pattern, i.e. the gravure, the thickness of the interlayer as well as the thickness of the wear-resistant layer are limited in the upward direction. The thickness of these interlayers should in no case be larger than 15 μm since otherwise the geometry of the embossed patterns and gravures is improperly altered and thus reproducibility is made questionable, the thickness of the wear-resistant layer should not exceed 8 μm.

The summed up thickness of the interlayer and of the wear-resistant layer is limited in the downward direction, i.e. the minimum thickness, in order to obtain a layer that is still of adequate, avoiding micro porosity of the layers. In the case of layer thicknesses of about 10 μm, an interlayer of nickel, for example, can also be still minimally porous, but this porosity is eliminated by the wear-resistant layer to be vapor-deposited subsequently, since the material of the wear-resistant layer diffuses into the interlayer and then forms therewith a closed and corrosion-resistant coating.

Inasmuch as the wear-resistant layer is applied by vapor deposition under vacuum at elevated temperatures, the interlayer material must be chosen so that it also withstands these temperatures; in this connection, nickel, nickel alloy or a ceramic material have proven themselves well as a basic material for the interlayer.

It is also possible to form an interlayer of a first layer autocatalytically deposited on the base member and made up of a nickel-phosphorus alloy having a phosphorus content of 3–13% by weight in a layer thickness of about 4–8 μm and of a second layer deposited thereon electrolytically and consisting essentially of chromium with a layer thickness of about 4–8 μm. Such a two-layer intermediate coat has the advantage that the nickel-phosphorus layer forms a homogeneous, dense layer; whereas the chromium layer applied thereon is not as dense, i.e. exhibits a higher microporosity, but exhibits a higher hardness according to Vickers than nickel-phosphorus layer of up to about 1200 HV. The higher the hardness of the interlayer, the higher will also be the attainable hardness of the wear-resistant layer to be vapor-deposited thereon. The summarized thicknesses of the first and second layer constituting the interlayer is limited to 10–15 μm.

Preferred materials for the wear-resistant layer are metallic borides, metallic carbides, metallic nitrides, metallic oxides, metallic silicides of the elements of the fourth to sixth subgroups B of the Periodic Table, titanium, zirconium, hafnium and vanadium, respectively, niobium, tantalum and chromium, respectively, molybdenum tungsten, individually or in combinations. The carbides, nitrides and oxides of the elements of the fourth subgroup B of the Periodic Table, which are distinguished especially by hardness and wear resistance, are more preferably used for the wear-resistant layer. For example, titanium-nitride, titanium-aluminum-carbonitride, or titanium-aluminum-nitride, titanium-carbonitride or titanium-carbide are employed for the wear-resistant layer. With these "hard materials" for the wear-resistant layer, applied in accordance with the PVD process onto the interlayer-equipped gravure or embossed pattern of a base member, hardnesses can be achieved of 2500 to 3200 HV. Likewise suitable is hafnium boride, distinguished by a Vickers hardness of about 3200 HV.

The wear-resistant layer is vapor-deposited in a thickness of about 4–8 μm, preferably about 5–7 μm. With the formation of the interlayer from a nickel-phosphorus layer and chromium layer, these layers jointly should not exceed a thickness of about 15 μm. Chromium has a higher hardness than nickel but has the drawback that it starts to dissolve and becomes porous at the temperatures to be utilized according to this process for the vapor deposition of the wear-resistant layer. However, since it is utilized, according to the invention, on a substrate preferably of a nickel-phosphorus alloy, this nickel-phosphorus alloy can absorb the effects of the temperature on the chromium and can stabilize the chromium layer. At the same time, though, this interlayer is provided, on account of the chromium coating with a hardness and wear resistance which, in total is higher than those of a nickel-phosphorus alloy layer by itself. The high hardness of the interlayers based upon metal compounds are reached by tempering the base member equipped with the interlayer integrated as heating up step in the PVD-process of applying the outer wear-resistant layer onto the interlayer.

The rolls and plates which can be produced by, the process of this invention and which are provided with a gravure and/or an embossed pattern can be manufactured in a reproducible fashion and exhibit a high wear resistance, i.e. they have a substantially increased operating lifetime and a hardness of at least about 2000 HV depending on the type of vapor-deposited, metal-hard material compound.

With the deposition of an interlayer made up of a nickel-phosphorus alloy, as proposed by the present invention a very homogeneous; dense layer is obtained.

This involves a known method of autocatalytic or external electroless nickel-phosphorus alloy deposition. The chemical nickel bath contains, besides nickel ions, reducing agents, utilizing sodium hypophosphite in most cases. From this bath, nickel-phosphorus alloys are then deposited with phosphorus contents of between about 3 and 13% by weight.

It is possible by means of the process according to this invention to equip engraved rolls or plates for printing processes or the like with a very high-resolution of the embossed patterns and gravures with high precision in a wearproof fashion.

BRIEF DESCRIPTION OF THE DRAWINGS

The invention will be described by way of example below with reference to the drawing wherein.

DETAILED DESCRIPTION OF THE INVENTION

Figure 1:
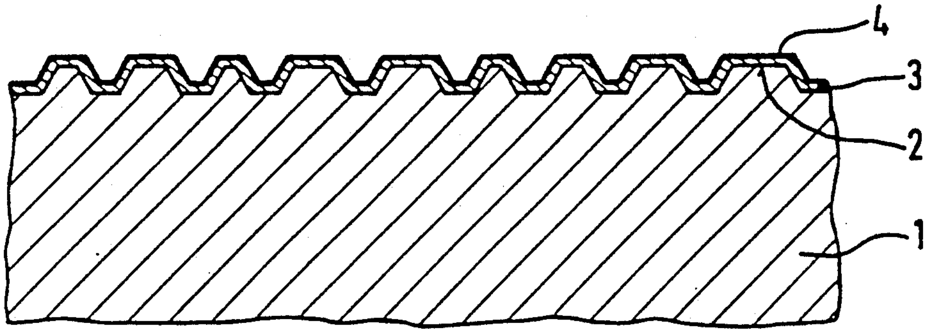
FIG. 1 shows schematically in cross section the structure of an engraved plate with one interlayer and one wear-resistant layer.

The base member 1, for example for an embossing tool made of a metal, such as steel, and nonferrous metal, for example brass, bronze, has the basic configuration of a cube, for a gravure plate, or of a tube with very large wall thicknesses or of a cylinder for a gravure roll. The surface of the base member 1 is provided in the desired areas, in correspondence with the desired embossed pattern, with the gravure 2 by mechanical, electro-mechanical methods or by means of etching. The base member 1, thus equipped with the gravure 2, is subsequently coated, after cleaning, at least in the zone of the engraved surface with an autocatalytically deposited nickel-phosphorus alloy interlayer 3, i.e. by an electroless deposition procedure, in a constant thickness of about 15 μm. Thereafter, the base member 1, thus provided with the interlayer 3, is polished and cleaned and then is heated up under vacuum to a temperature of 400° C. and tempered at this temperature of about 400° C. for a period of 2.5 hours. The hardness of this interlayer 3 can be raised by tempering at temperatures above 240° C. for at least one hour. Before tempering the base member 1 with interlayer 3, the surface of the interlayer 3 on the base member is polished and cleaned at least in the region of the engraved and coated surface. Thereafter the combined tempering process for the interlayer and application of a wear-resistant layer by PVD-process follows. Subsequently, a wear-resistant layer 4 can be applied in accordance with the PVD method as the outermost layer by vapor deposition of a corresponding metallic hard material compound, for example titanium nitride, under a high vacuum in a vacuum chamber at temperatures of up to 480° C. During this step, the base member 1 with interlayer 3, which is at room temperature, is gradually heated under vacuum to the appropriate tempering temperature of about 400° C. and tempered for a period of 2.5 hours. Thereafter, the vacuum deposition of the hard material compound is procured at a temperature according to the tempering temperature or higher, f.i. 480° C. by a so-called vacuum arc between a negative poled cathode and a positive poled anode with low voltage of about 20 V and high current intensity of about 100 A in the vacuum chamber. For deposition of titanium nitride the cathode consists of titanium, which is vaporized and ionized and accelerated by the arc. Further the reactive gas component nitrogen is introduced into the vacuum chamber. The wear-resistant layer should exhibit a thickness of about 5–7 μm. After cooling the base member 1, thus provided with layers 3 and 4, and after the vapor deposition of the layer 4, the vapor-deposition layer is likewise superficially polished. In this manner, the engraved plate or roll is equipped with a wearproof layer of about 3000 HV. This engraved roll or plate can be manufactured in a reproducible fashion by following this procedure.

Figure 2:
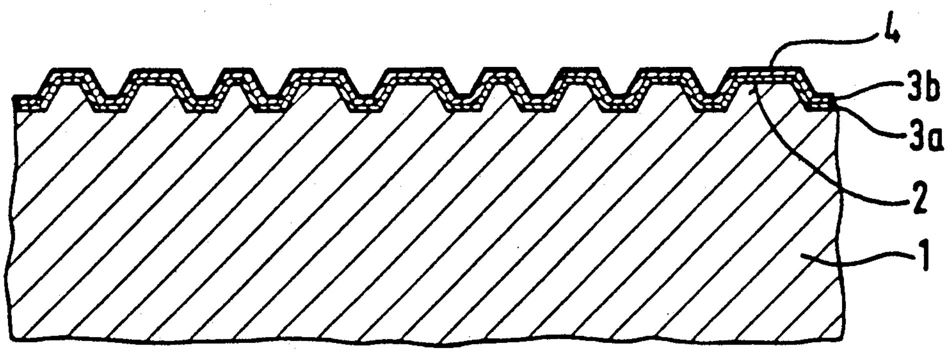
FIG. 2 shows schematically in cross section the structure of an engraved plate with a two-coating interlayer arrangement and a wear-resistant layer.

In the fragmentary schematic structure of an engraved plate or roll illustrated in FIG. 2, the base member 1 is likewise provided with the engraved surface 2. On the surface 2, a first interlayer 3*a* of a nickel-phosphorus alloy is autocatalytically deposited in a layer thickness of about 5 μm. Optionally after required cleaning processes, a chromium layer 3*b* having a thickness of 5 μm is electrolytically applied thereon and the surface cleaned and polished. Then the engraved, coated base member 1, 3*a*, 3*b* is tempered by heat treatment under vacuum at temperatures of preferably up to 400° C. and subsequently, as described in the embodiment according to FIG. 1, a wear-resistant layer 4 is vapor-deposited thereon, made up, for example, of titanium nitride or titanium carbide.

By means of the process according to this invention, engraved rolls and plates with extremely fine gravure patterns, for example 40,000 holes per 1 $cm^2$, each having a depth about 16 μm, can be manufactured in a reproducible fashion with a surface hardness from 2000 HV depending on the hard material for the wear-resistant layer. Such gravures are needed, for example, for gravure and coating rolls in variegated ways for printing processes.

The smallest gravure rolls (engraved rolls) have a diameter of 10 mm with the smallest length about 20 mm, the biggest engraved rolls have diameters of about 500 mm and a length up to 3500 mm.

What is claimed is:

1. A process for the protection of engraved rolls and plates for flexographic printing, intaglio printing or coating, wherein the rolls or plates each comprise a base member of metal, having a surface whereupon a gravure is engraved mechanically, electromechanically, or by etching, in correspondence with an embossed pattern, and wherein thenprotective layers for increasing corrosion resistance of a metal or metal component or ceramic component are applied on the engraved surface of the base member in order to increase the wear resistance and corrosion resistance, characterized in that a) a dense interlayer of a metal-containing component or ceramic-containing component having a thickness of about 10–15 μm and a hardness of at least 850 HV according to Vickers hardness is applied to the surface of the base member provided with the gravure; thereby reproducing the engraved gravure of the surface of the base member to a surface of the interlayer b) thereafter the surface of the interlayer applied on the engraved surface of the base member is polished and cleaned, c) thereafter the engraved base member equipped with the interlayer is subjected to vacuum and while being kept under vacuum the engraved base member is continuously heated up for tempering purposes to a temperature of at least 240° C. to about 480° C. and is subjected to this temperature for a time period of at least 1 hour up to about 4 hours, d) then at the end of the tempering period while the tempered engraved base member equipped with the interlayer is continuously subjected to vacuum and is kept in a heated up condition of a temperature between 200° and 480° C. there is applied to the surface of the interlayer applied on the surface of the base member provided with the gravure a wear-resistant layer of a metal compound having a hardness according to Vickers hardness of at least 2000 HV by physical vapor deposition in a thickness of about 4–8 μm, thereby reproducing the engraved gravure of the surface of the base member with applied interlayer to the surface of the vapor-deposited wear-resistent layer e) then after removal of the vacuum, the surface of the vapor-deposited wear-resistant layer, is polished.

2. A process according to claim 1, characterized by producing, as the interlayer, an autocatalytically deposited nickel-phosphorus alloy with a phosphorus content of 5–13% by weight.

3. A process according to claim 1, characterized in that an interlayer of a silicon carbide is applied by spraying.

4. A process according to claim 1, characterized in that the interlayer is formed from a first coating, autocatalytically deposited onto the base member, of a nickel-phosphorus alloy with a phosphorus content of 3–13% by weight in a layer thickness of about 4–8 μm, and a second coating, deposited thereon electrolytically of chromium with a layer thickness of about 4–8 μm, whereby the summarized thickness of the thicknesses of the first and second coating is limited to about 10 to 15 μm.

5. A process according to claim 1, characterized by utilizing, for the wear-resistant layer, at least one of metallic borides, metallic carbides, metallic nitrides, metallic oxides, and metallic silicides wherein the metallic elements are selected from the group consisting of the elements of the fourth to sixth subgroups B of the Periodic Table.

6. A process according to claim 1, characterized by utilizing, for the wear-resistant layer, at least one of the metallic borides, metallic carbides, metallic nitrides and metallic oxides, wherein the metallic elements are selected from the group consisting of the elements of the fourth subgroup B of the Periodic Table.

7. A process according to claim 1, characterized by using titanium nitride for the wear-resistant layer.

8. A process according to claim 1, characterized by using titanium aluminum nitride or titanium aluminum carbonitride for the wear-resistant layer.

9. A process according to claim 1, characterized by using titanium carbonitride for the wear-resistant layer.

10. A process according to claim 1, characterized by using titanium carbide for the wear-resistant layer.

11. A process according to claim 1, characterized by utilizing, for the wear-resistant layer, at least one of metallic borides, metallic carbides, metallic nitrides, metallic oxides, and metallic silicides wherein the metallic elements are selected from the group consisting of titanium, zirconium, hafnium and vanadium.

12. A process according to claim 1, characterized by utilizing, for the wear-resistant layer, at least one of metallic borides, metallic carbides, metallic nitrides, metallic oxides, and metallic silicides wherein the metallic elements are selected from the group consisting of niobium, tantalum and chromium.

13. A process according to claim 1, characterized by utilizing, for the wear-resistant layer, at least one of metallic borides, metallic carbides, metallic nitrides, metallic oxides, and metallic silicides wherein the metallic elements are selected from the group consisting of molybdenum and tungsten.

* * * * *